(12) United States Patent
Bernstein et al.

(10) Patent No.: US 12,143,110 B2
(45) Date of Patent: Nov. 12, 2024

(54) CONTROL CIRCUIT FOR RING OSCILLATOR-BASED POWER CONTROLLER

(71) Applicant: Ariel Scientific Innovations Ltd., Ariel (IL)

(72) Inventors: Joseph B. Bernstein, Hashmonaim (IL); Ilan Aharon, Bruchin (IL)

(73) Assignee: Ariel Scientific Innovations Ltd., Ariel (IL)

( * ) Notice: Subject to any disclaimer, the term of this patent is extended or adjusted under 35 U.S.C. 154(b) by 22 days.

(21) Appl. No.: 18/010,229

(22) PCT Filed: Jun. 15, 2021

(86) PCT No.: PCT/IL2021/050721
§ 371 (c)(1),
(2) Date: Dec. 14, 2022

(87) PCT Pub. No.: WO2021/255729
PCT Pub. Date: Dec. 23, 2021

(65) Prior Publication Data
US 2023/0253957 A1    Aug. 10, 2023

Related U.S. Application Data

(60) Provisional application No. 63/039,002, filed on Jun. 15, 2020.

(51) Int. Cl.
*H03K 3/0231*     (2006.01)
*H02M 1/08*       (2006.01)
(Continued)

(52) U.S. Cl.
CPC ........... *H03K 3/0231* (2013.01); *H02M 1/08* (2013.01); *H02M 1/38* (2013.01); *H02M 1/385* (2021.05);
(Continued)

(58) Field of Classification Search
CPC .... H03K 3/0231; H03K 3/011; H03K 3/0315; H03K 5/2472; H03K 7/08; H03K 17/302;
(Continued)

(56) References Cited

U.S. PATENT DOCUMENTS

2008/0036531 A1*   2/2008   Boe ..................... H02M 3/07
                                                              327/538
2017/0302151 A1    10/2017  Snook
(Continued)

FOREIGN PATENT DOCUMENTS

| CN | 109495095 | 3/2019 |
| CN | 110380709 | 10/2019 |
| WO | WO 2021/255729 | 12/2021 |

OTHER PUBLICATIONS

Li, Sheng Teng, et al. "A 10MHz GaN based buck converter with dynamic pull-up resistor gate driver." 2019 IEEE 4th International Future Energy Electronics Conference (IFEEC). IEEE, 2019. (Year: 2019).*

(Continued)

*Primary Examiner* — Ryan Johnson

(57) ABSTRACT

An integrated circuit is built with enhancement mode Gallium Nitride (GaN) components. The integrated circuit comprises a comparator circuit which compares an input voltage with a reference voltage to provide a controllable constant current source, the comparator having a drive transistor having a positive threshold voltage, the drive transistor being switched on and off based on a comparison result of the comparator. The circuit may drive ring oscillators and may provide pulse width modulation with variable duty cycle at constant frequency.

21 Claims, 16 Drawing Sheets

(51) Int. Cl.
*H02M 1/38* (2007.01)
*H02M 3/158* (2006.01)
*H03K 3/011* (2006.01)
*H03K 3/03* (2006.01)
*H03K 5/24* (2006.01)
*H03K 7/08* (2006.01)
*H03K 17/30* (2006.01)

(52) U.S. Cl.
CPC ............ *H02M 3/158* (2013.01); *H03K 3/011* (2013.01); *H03K 3/0315* (2013.01); *H03K 5/2472* (2013.01); *H03K 7/08* (2013.01); *H03K 17/302* (2013.01); *Y02B 70/10* (2013.01)

(58) Field of Classification Search
CPC .......... Y02B 70/10; H02M 1/08; H02M 1/38; H02M 1/385; H02M 3/158
See application file for complete search history.

(56) References Cited

U.S. PATENT DOCUMENTS

| | | |
|---|---|---|
| 2018/0191244 A1 | 7/2018 | Lin |
| 2020/0044032 A1 | 2/2020 | Haeberlen et al. |
| 2020/0076413 A1 | 3/2020 | Lee et al. |
| 2020/0091905 A1 | 3/2020 | Bernacchia et al. |

OTHER PUBLICATIONS

Wang, Hanxing, et al. "A GaN pulse width modulation integrated circuit." 2014 IEEE 26th International Symposium on Power Semiconductor Devices & IC's (ISPSD). IEEE, 2014. (Year: 2014).*

Pandey, Vimal Kant, Cher Ming Tan, and Sandeep Sharma. "Design of GaN based comparator circuit for radiation detectors." 2020 IEEE 17th India Council International Conference (INDICON). IEEE, 2020. (Year: 2020).*

Tang, Gaofei, et al. "Digital integrated circuits on an E-mode GaN power HEMT platform." IEEE Electron Device Letters 38.9 (2017): 1282-1285. (Year: 2017).*

EPC. "EPC8002 Datasheet". 2023. Retrieved from https://epc-co.com/epc/products/gan-fets-and-ics/epc8002 on Mar. 4, 2024 (Year: 2023).*

International Preliminary Report on Patentability Dated Dec. 29, 2022 From the International Bureau of WIPO Re. Application No. PCT/IL2021/050721. (6 Pages).

International Search Report and the Written Opinion Dated Sep. 19, 2021 From the International Searching Authority Re. Application No. PCT/IL2021/050721. (15 Pages).

* cited by examiner

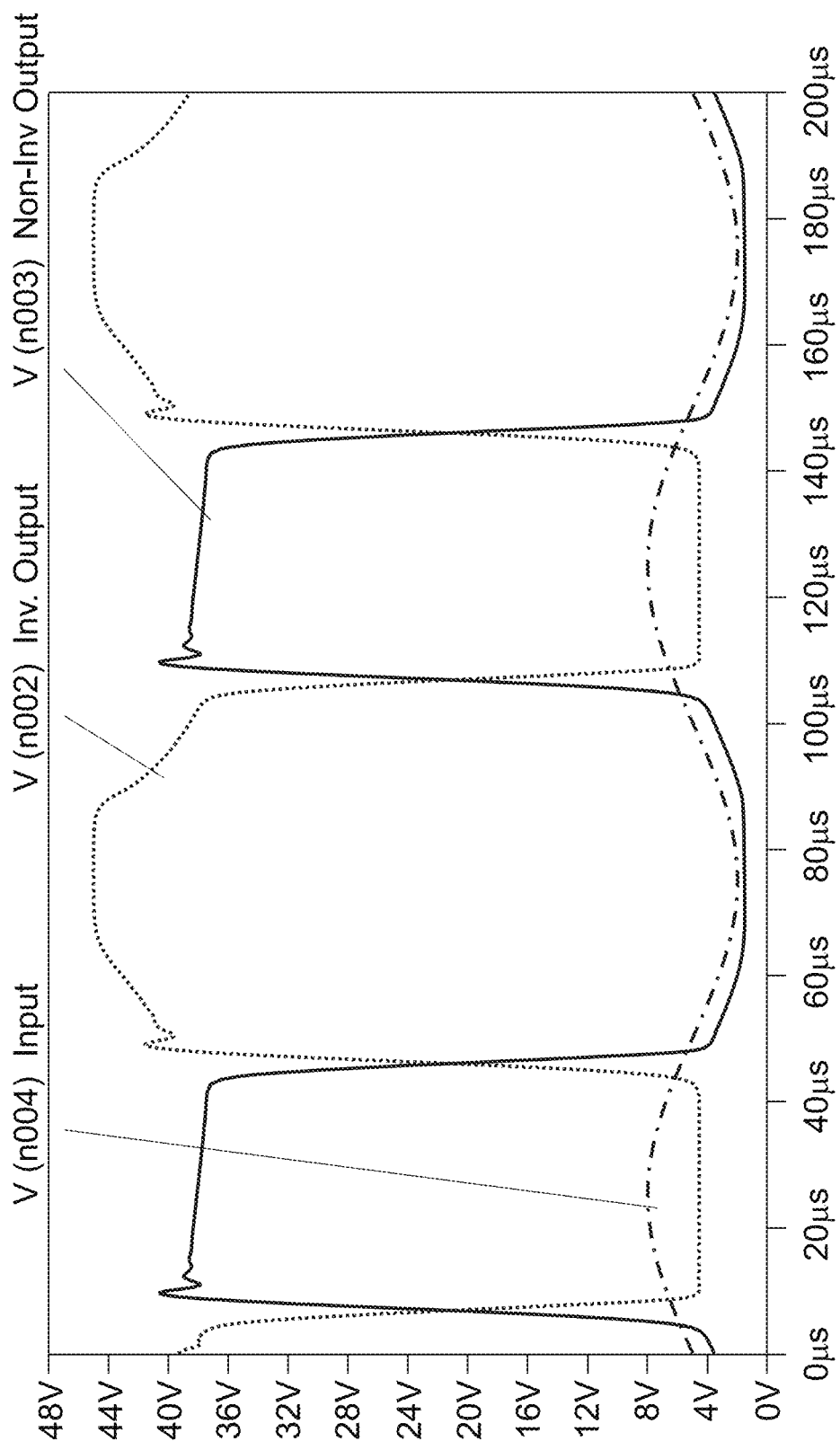

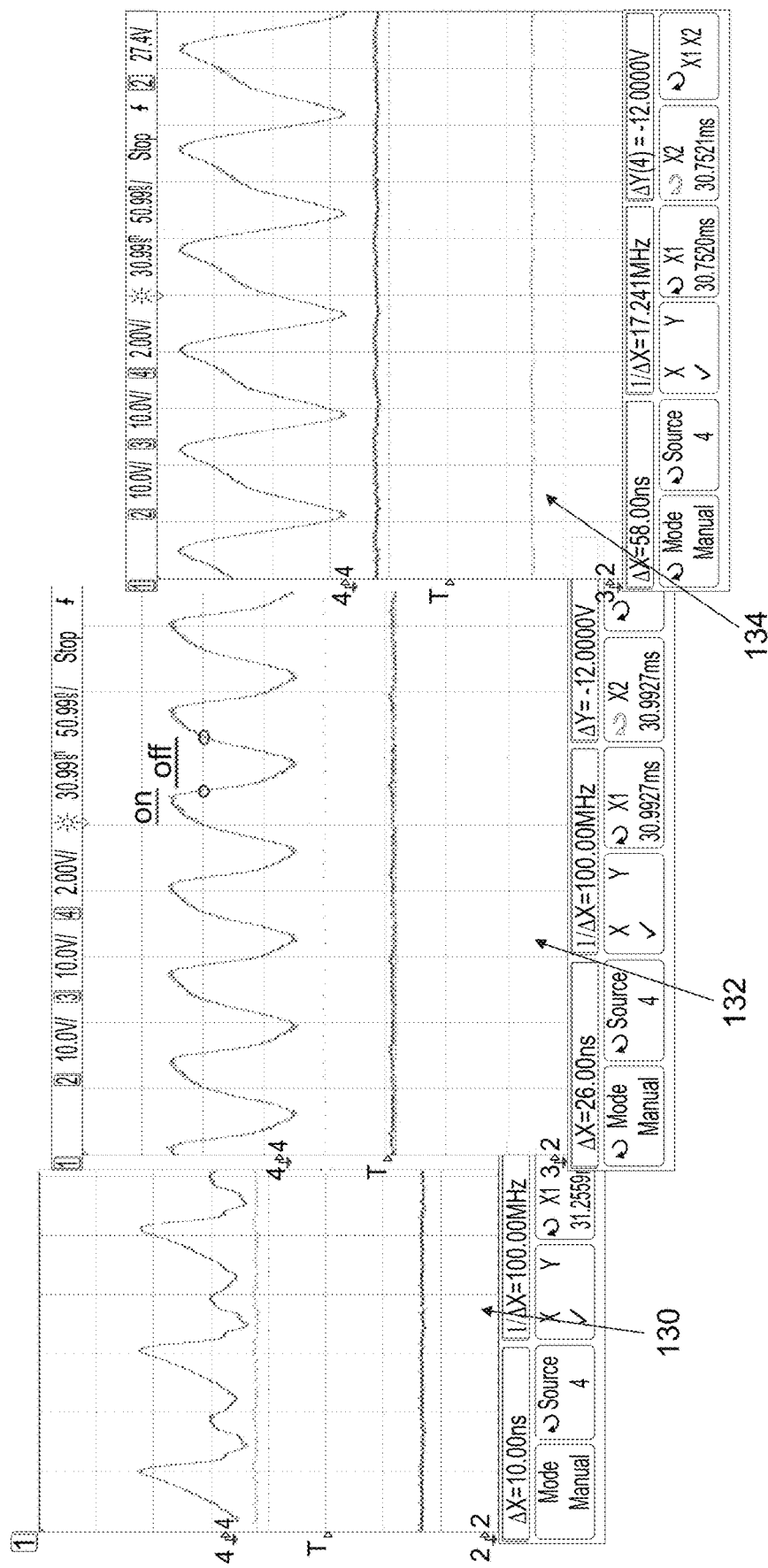
Fig. 15  Duty Cycle from ~10% to ~90% on PWM

CONTROL CIRCUIT FOR RING OSCILLATOR-BASED POWER CONTROLLER

RELATED APPLICATION/S

This application is a National Phase of PCT Patent Application No. PCT/IL2021/050721 having International filing date of Jun. 15, 2021, which claims the benefit of priority under 35 USC § 119(e) of U.S. Provisional Patent Application No. 63/039,002 filed on Jun. 15, 2020. The contents of the above applications are all incorporated by reference as if fully set forth herein in their entirety.

FIELD AND BACKGROUND OF THE INVENTION

The present invention, in some embodiments thereof, relates to a control circuit for a ring oscillator-based power converter and, more particularly, but not exclusively, to a way of providing such a device on a Gallium Nitride-only integrated circuit.

The principle of the GaN-only comparator circuit operation is the same as a standard MOS-based comparator with one major exception. The problem with GaN devices is the variability of the threshold voltage from one transistor to the next. Hence, a standard current mirror approach, which is the basis for any silicon-based comparator, will not work with GaN HEMT transistors. Therefore, the key to implementing a voltage comparator circuit suitable to be used in a GaN-only pulse-width modulator (PWM) is to design a reliable current source that works despite the above limitations. The importance of keeping all the transistors as GaN devices is so that the whole circuit may be integrated into a single integrated circuit or chip, and it is not possible or certainly not efficient to provide a hybrid of GaN and Silicon in the same IC.

More particularly, a difficulty with implementing a ring oscillator-based power converter is the control circuitry required to change the operational duty cycle while maintaining a constant frequency. Previous implementations may for example have used variable resistors for two of the legs of the oscillator while the third leg remained constant as a basic inverter.

Until now, a basic ring oscillator test circuit has no control circuit proposed that allows continuous control of the relative duty cycle while maintaining a nearly constant frequency as is needed for a power-converter configuration as well as for a Class-D type switching amplifier. By nearly the same frequency, we refer to frequency deviations of no more than 20% or in worst cases 50% of the expected switching frequency.

CN104049666A teaches a similar but depletion mode device, which provides a constant current source and depend on a negative Vt.

US20170019069A1—teaches a self-regulating current source. The disclosure uses depletion mode GAN HEMTD devices having a negative threshold voltage.

Most commercially available GaN devices are normally off whereas depletion mode, and PA is normally on. There is currently no solution for the desired control system that could be built on the same IC as with normally off devices.

US20140177304A1 teaches a workaround to the present problem using capacitors.

SUMMARY OF THE INVENTION

The present embodiments may provide a reliable voltage based current source using only enhancement mode, normally "off" transistors.

The present embodiments may utilize a load transistor associated with each leg of the oscillator as controlled loads. Two loads are controlled by the differential amplifier comparator with a known reference voltage. When the input voltage is below the reference voltage, the inverting output goes "high" while the non-inverting output goes "low". The opposite occurs when the input voltage goes above the reference as is typical of a difference amplifier.

The present embodiments may thus feed the outputs from such a difference amplifier to control the two load transistors from the ring oscillator. When one leg is high, the transistor is "On" allowing a short rise-time for the node driving the second stage (which is off at that time). When the second stage is "Off", there is a high resistance in parallel with the load switch, increasing the "Off" time of the second stage.

Since the output of the difference amplifier is always opposite, when one load is "on" then the other is "off" and a continuous control is applied allowing the effect of a pulse-width modulation (PWM) controlled by the input voltage in reference to the reference voltage.

The present embodiments may thus provide an enhancement mode voltage controlled current source, and furthermore may use the circuit as a comparator. The present embodiments may use the circuit to govern a ring oscillator.

The present embodiments have positive Vt.

According to an aspect of some embodiments of the present invention there is provided an integrated circuit built with enhancement mode Gallium Nitride (GaN) components, the integrated circuit comprising a comparator circuit configured to compare an input voltage with a reference voltage to provide a controllable constant current source, the comparator having a first drive transistor having a positive threshold voltage, the drive transistor being switched on and off based on a comparison result of the comparator.

An embodiment may comprise a second drive transistor connected in respect of the first drive transistor, the two drive transistors providing complementary pull up and pull down drivers.

An embodiment may comprise an odd number of ring oscillator stages connected after the drivers, the ring oscillator stages forming a ring oscillator having a constant frequency.

An embodiment may be configured such that the comparator circuit combined with the ring oscillator provides a pulse width modulator governed by the comparator circuit.

In an embodiment, the ring oscillator stages comprise a boost converter or a buck converter or a buck-boost converter.

In an embodiment, at least one oscillator comprises a drive transistor having a source and a drain and resistors connected to each of the source and the drain.

In an embodiment, the resistor connected to the drain provides a current regulator to regulate a drive current provided by the stage.

An embodiment may be configured such that a frequency of the ring oscillator is maintained and the comparator result is used to change a duty cycle of the ring oscillator without substantially changing the frequency.

Embodiments may use a boost convertor or a buck convertor to set the duty cycle.

A dead time correction circuit may be set up, for example using a latch.

According to a further aspect of the present invention, instead of an integrated circuit, discrete components may be used to build an electrical circuit comprising enhancement mode Gallium Nitride (GaN) components, the circuit comprising a comparator circuit configured to compare an input voltage with a reference voltage to provide a controllable constant current source, the comparator having a first drive transistor having a positive threshold voltage, the drive transistor being switched on and off based on a comparison result of the comparator.

According to a third aspect of the present invention there is provided a method of controlling an integrated circuit built with enhancement mode Gallium Nitride (GaN) components, the method comprising providing a comparator circuit which compares an input voltage with a reference voltage to output a controllable current at a drive transistor, the comparator having a first drive transistor having a positive threshold voltage, the drive transistor being modulated from on to off based on a comparison result of the comparator, thereby to provide the controllable current.

The method may involve providing the controllable current as a constant current, the first drive transistor being either fully on or fully off.

The method may involve providing a second drive transistor connected in respect of the first drive transistor, the two drive transistors providing complementary pull up and pull down drivers.

The method may comprise connecting an odd number of ring oscillator stages connected after the drivers, the ring oscillator stages forming a ring oscillator having a constant frequency.

The method may comprise operating the ring oscillator as a pulse width modulator governed by the comparator circuit.

The method may comprise driving the ring oscillator stages as a boost converter or a buck converter or a boost-buck converter.

In embodiments, a frequency of the ring oscillator is maintained and the comparator result is used to change a duty cycle of the ring oscillator without changing the frequency.

The method may involve using a boost convertor or a buck convertor to set the duty cycle.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 2A and 2B are graphs showing output voltage levels for the circuit of FIG. 1;

FIG. 15 is a waveform diagram associated with the circuit of FIG. 10.

DESCRIPTION OF SPECIFIC EMBODIMENTS OF THE INVENTION

Figure 1:
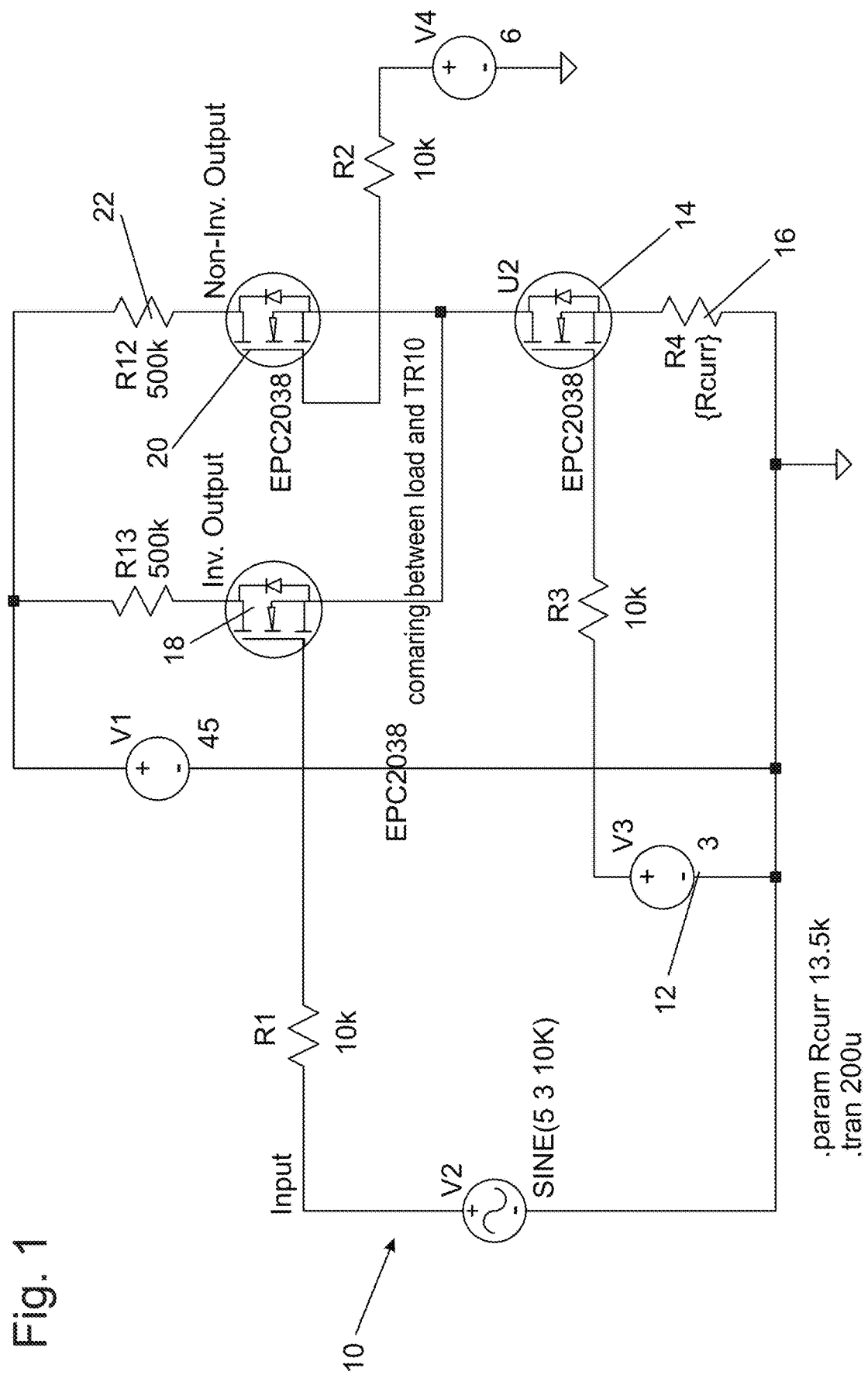
FIG. 1 is a simplified diagram showing a comparator circuit constructed of enhancement mode GaN components that provides a constant current source governed by an input voltage subtracted by the threshold voltage according to embodiments of the present invention.

The present invention, in some embodiments thereof, relates to a control circuit for a ring oscillator-based power converter and, more particularly, but not exclusively, to a way of providing such a device on a Gallium Nitride-only integrated circuit, and a way of providing a voltage controller for a pulse width modulated PWM ring oscillator.

Gallium Nitride or GaN may provide an enhancement mode, normally off transistor.

Gallium nitride is a material that allows for high mobility, and has a small but variable transition voltage, hence it gives a small transition region that is hard to localize and may in fact be at different levels in two different transistors.

The small and hard to localize transition region gives rise to a problem. It is not possible to design a current mirror, because a current mirror only works when there is a guarantee that the transition region is the same and this is not possible with the GaN transistor.

Control must therefore use a single transistor at full ON to operate an amplifier, hence requiring a voltage based current source in the case of GaN.

The issue is that the controller and the rest of the circuitry are required to be on the same integrated circuit chip so the problem cannot be solved by implementing the controller in silicon. In general GaN integrated circuits are not yet extensively used (as compared to silicon at the time of this invention filing), and the difficulty in providing control may be the reason. The voltage controlled current source may solve the problem in the present embodiments and a ring oscillator may be used as the Pulse Width Modulator.

A ring oscillator may further be provided with resistors between the source and drain. Again a voltage controlled current source is provided. A resistor at the drain may provide a current regulator, and may act as a comparator with a current source. As mentioned, unlike silicon, it is not possible to use a current mirror. The comparator may further serve as a drain for one leg of a ring oscillator.

Using a ring oscillator, it is possible to change the duty cycle at nearly a constant frequency. In general the frequency should be stable so that the inductance is stable. The duty cycle may be set using boost and buck converters, and it is possible to obtain pulse width modulation (PWM) by operating different duty cycles at substantially the same switching frequency. A switching converter is generally optimized at a certain frequency but there is a great deal of inherent flexibility related to the exact frequency. Hence, the frequency variation can be tolerated as much as 20% to even 50% without much degradation in the circuits performance.

Hence the present embodiments may provide a voltage controlled constant current source using GaN and having a positive threshold voltage (Vt). Using a positive threshold voltage makes it possible to control the current level. By contrast it is tricky to achieve a negative threshold voltage (as is the case with a depletion mode GaN transistor) and the negative threshold does not allow one to use voltage to control the current.

The present embodiments may provide a GaN based Comparator in which one can set a voltage for comparison.

The present embodiments may further provide a ring oscillator which is driven by the above comparator. Hence the present embodiments enable a GaN integrated circuit. There is control of a duty cycle at a pre-determined frequency to give PWM, and there are buck and boost, buck-boost and class D amplifiers.

Embodiments may provide an integrated circuit built with enhancement mode Gallium Nitride (GaN) components, the integrated circuit comprising a comparator circuit configured to compare an input voltage with a reference voltage to provide a controllable constant current source, the comparator having a first drive transistor having a positive threshold voltage, the drive transistor being switched on and off based on a comparison result of said comparator.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1 illustrates a comparator circuit 10 having a voltage controlled current source 12 according to an embodiment of the present invention. The voltage controlled current source consists of a reference voltage (V3) connected to the gate of a small, low current, transistor 14. The example in this figure is the EPC 2038 transistor. Of course, a smaller device may be substituted when the present circuit is integrated into a single chip along with a PWM and even, perhaps, the main power switches, as will be discussed in greater detail below.

The V3 reference voltage 12 is connected to the gate of the current source transistor 14 where the current is controlled by the source resistor (Rcurr) 16. The current through the transistor 14 is fixed by the reference voltage (V3) minus the threshold voltage of the transistor (between 1 and 2.5V) divided by the resistance, Rcurr. This current is then shared between the two upper transistors 18 and 20. When the input voltage (V2) is below the second reference voltage (V4) then the right-hand transistor, 20, is ON and the left-hand transistor, 18, is OFF. Thus, the voltage drop across resistor 22 is the full current from the current source times the resistance, which in the illustrated circuit is 500 kOhms). When the voltage at the ON transistor is low, it can go down to below the reference voltage, depending on the control current and drain resistor values.

The same is true when the input voltage goes above the threshold, the current moves to the other transistor 18 and the inverting output goes low while the non-inverting output goes high. Thus, the circuit of FIG. 1 works as a comparator of the input voltage as compared to the second reference voltage (V2) such that the inverting output goes high, to near the Drain voltage (V1) when the transistor is OFF. The opposite happens at the opposite transistor, which goes high when the input voltage is above the V2 reference voltage.

The circuit may be built of discrete components or as an integrated circuit. In either case the circuit may be built with enhancement mode Gallium Nitride (GaN) components, since the use of the present comparator circuit allows for a current source, even though a current mirror (as is common in silicon MOS devices) cannot be built using GaN components. The comparator circuit compares the input voltage with a reference voltage to provide a controllable constant current source. The comparator compares the input and reference voltages and changes state in accordance with the comparison result with only a small difference related to the threshold voltage difference. In either state the drive transistor, which always has a positive threshold voltage, is either full on or full off and thus acts as a controllable current source. The comparator thus has a first drive transistor having a positive threshold voltage, the drive transistor being switched on and off based on a comparison result of said comparator, and typically is provided with a second drive transistor connected in the opposite configuration, so that when the first drive is off the second drive is on and vice versa. The two drive transistors may provide complementary pull up and pull down drivers.

Figure 2B:
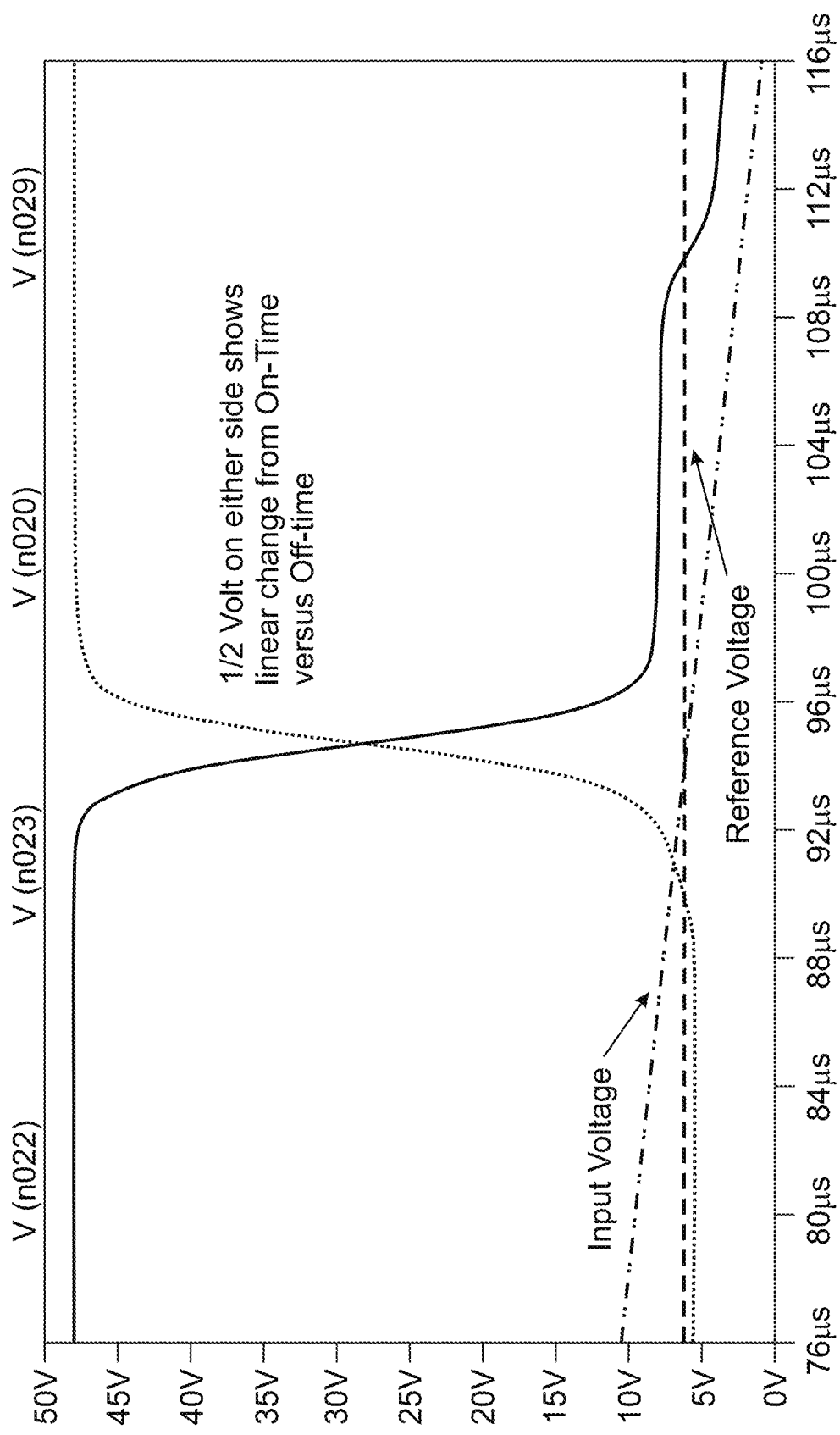

Reference is now made to FIG. 2A, which schematically illustrates the output of the comparator circuit of FIG. 1. The input voltage is V004 and the reference voltage is fixed at 6 volts (V2). When the sine-wave input is above V2, we see the inverting output (V002) voltage goes low, even below the reference voltage, V2, but higher than the lower reference voltage, V3. Similarly, the non-inverting output voltage (V003) goes high when the reference voltage goes above the reference voltage V3. FIG. 2B is a closeup view of the transition point.

The illustrated voltages can be used to control or govern the current sources of a ring oscillator circuit as described hereinbelow.

Figure 3:
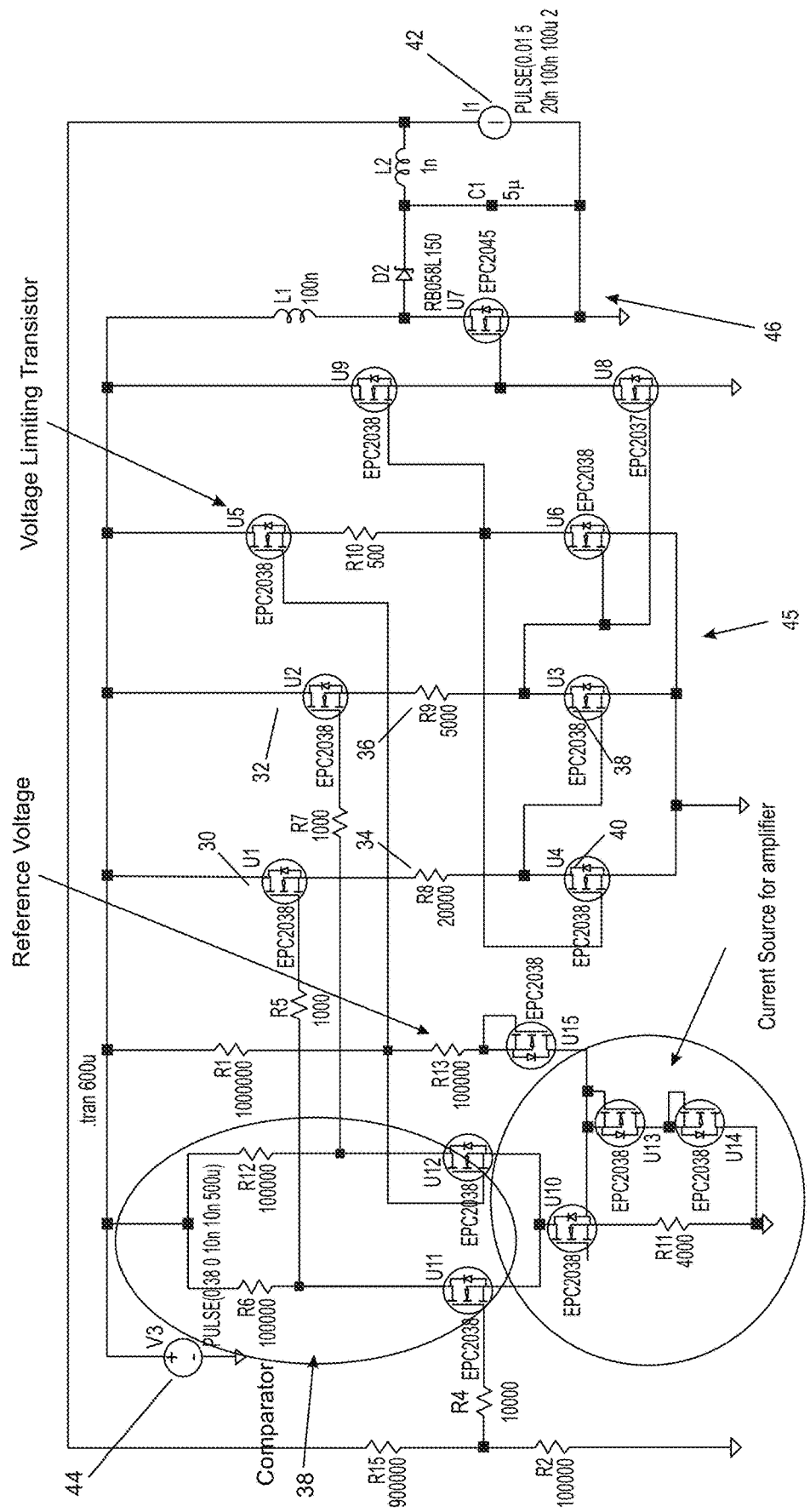
FIG. 3 is a simplified diagram showing how the comparator of FIG. 1 may be connected to subsequent ring oscillator stages so that the comparator circuit governs the ring oscillator thereby constructed.

Reference is now made to FIG. 3 which is a theoretical circuit diagram in which the output of the comparator circuit of FIG. 1 is connected to two stages of a 3-stage, or any other odd-number of stages, ring oscillator, thus to provide control according to the present embodiments. The principle of such a configuration is to use the current controlled property of the gate voltage going to the gate of a control transistor having a fixed resistance at the source. The first two UPPER transistors, 30, 32, control two phases of the ring oscillator output. The current through the source resistors 34 and 36 is the output voltage of the comparator circuit 38, described previously. These voltages go from minimum to maximum voltages and the voltages are complimentary. Hence, when the gate voltage to 30 is high, the voltage at 32 is low. In this case, the current going into the gates of the lower Drive transistors 40 and 38, is limited by the voltage at the gates of the upper (load) transistors 30 and 32 in series with the source resistors 34 and 36.

The rise time of each stage of the ring oscillator is the time to raise the voltage until the next two phases turn on. Hence the rise time is shorter when the current is higher and longer when the current is lower. Hence, the gate voltage on the upper load transistors 30 and 32 determines the rise times of the respective stages. Since these two stages are opposite each other, that is when one is high-current, the other is low-current and vice versa. Accordingly, the frequency may be substantially maintained while the duty cycle is varied from mostly "ON" to mostly "OFF". Thus, we see that this control circuit can make a voltage-controlled duty cycle at nearly the same frequency. The third phase is connected to the output and is maintained to have a relatively high-speed relative to the other two phases. This allows the full frequency and duty cycles to be controlled primarily by the voltages at the gates, keeping control of the pulse-width modulator (PWM) that is fed to the output transistors. It is noted that herein the term "substantially" is used to refer to the frequency being essentially maintained as the duty cycle is changed, but varying slightly, principally as an effect of the change in duty cycle.

Thus, FIG. 3 provides two reference voltages, 42 and 44. Reference voltage 42 drives the current, and reference voltage 44 serves as the input for the comparator.

Figure 4:
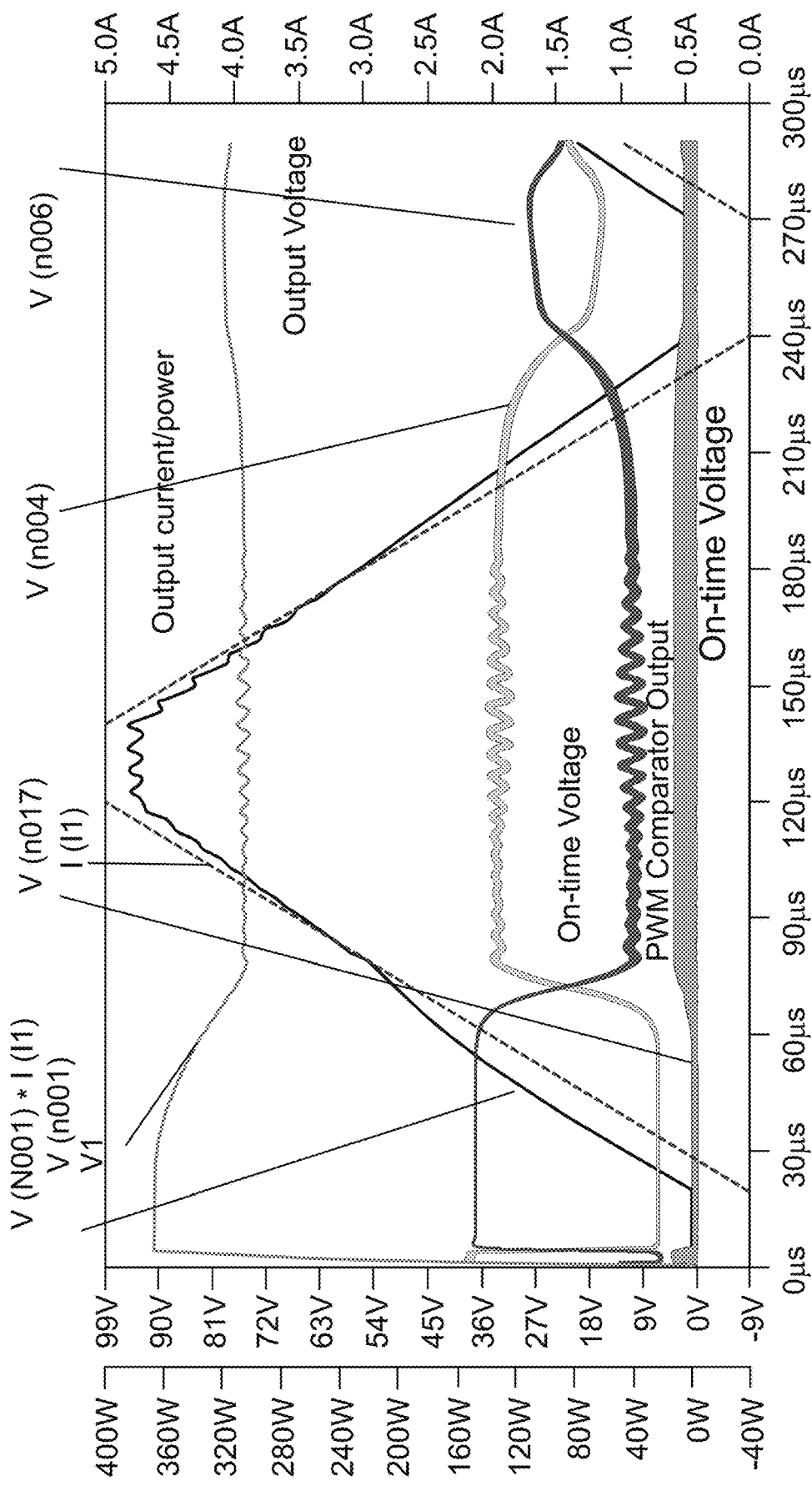
FIG. 4 is a graph of voltage outputs for the device of FIG. 3.

Reference is now made to FIG. 4, which shows the input and output voltages for the device of FIG. 3. V6 shows the PWM comparator output which oscillates between an on-time voltage and an off-time voltage. As explained, the embodiment comprises a ring-oscillator configuration comprising an odd number of stages as shown in FIG. 3. The drains of the upper transistor are connected to a single node that is connected to a power supply that holds a constant voltage, (V1 on the schematic) and allows significant current to flow. The gates of the upper transistors are connected separately to different voltage sources. The first two transistors of the RO circuit are connected to the difference amplifier shown on the left hand side of the schematic. The upper source is connected to the drain of the lower device, which is also connected to the lower gate of the following device. The final stage is connected to the gate of the first stage, so as long as there is an odd number of stages, each comprising two series transistors, the device will ring when the gate voltage is above the threshold for the circuits to oscillate.

The circuit of FIG. 3 may be divided into three parts, as follows:
1. Control Amplifier (the difference amplifier comparing the input voltage with a reference voltage), marked as comparator 38,
2. Ring Oscillator PWM (Pulse Width Modulator), made up of three stages, 45
3. Main Switch driver connected to the main power switch.

A basic Ring Oscillator (RO) is known to be used as a test circuit for reliability testing of the device performance. A pulse width modulator (PWM) circuit is also known to provide a basis for a power converter where the PWM circuit drives a "main switch" that transfers the energy from a voltage source to an output at either a higher voltage (Boost converter) or a lower voltage (Buck converter), etc. The configuration as known may also be modified to provide a Buck-Boost converter. The present invention differs from these earlier disclosures in that it relates to a control circuit consisting of a current-source driven difference amplifier consisting of enhancement mode only (N-type) High electron mobility transistors (HEMT), specifically using commercially available GaN transistors (such as available from EPC corporation or GaN Systems, etc.)

Figure 5:
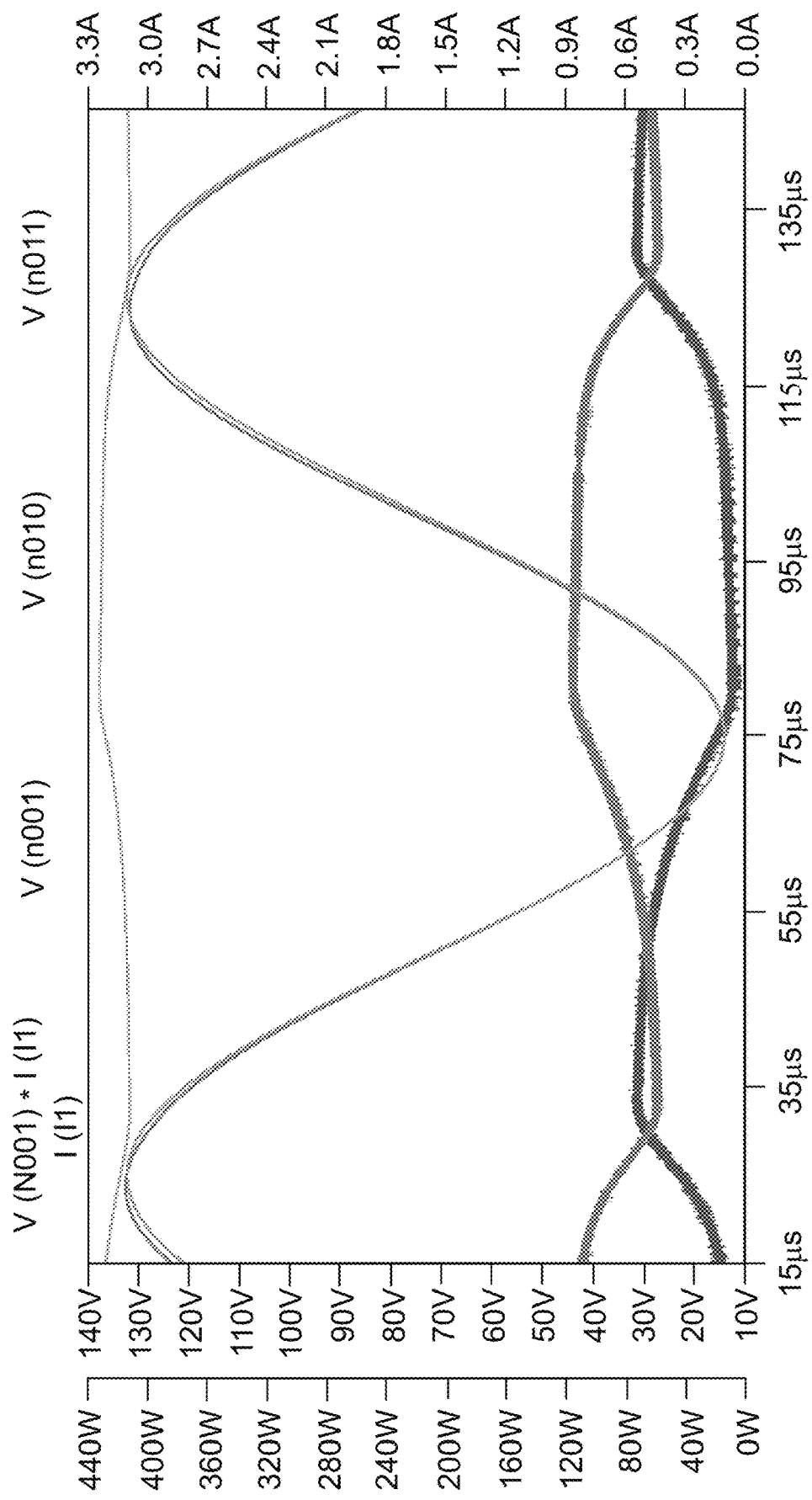
FIG. 5 is a simplified diagram showing how a modulated voltage may drive a switching mode, class-D amplifier.

The input voltage can be the feedback voltage of the converter output, as shown in this schematic. In other embodiments, this can be the modulated voltage driving a switching mode, class-D amplifier. The resulting waveforms are shown in FIG. 5.

Figure 6:
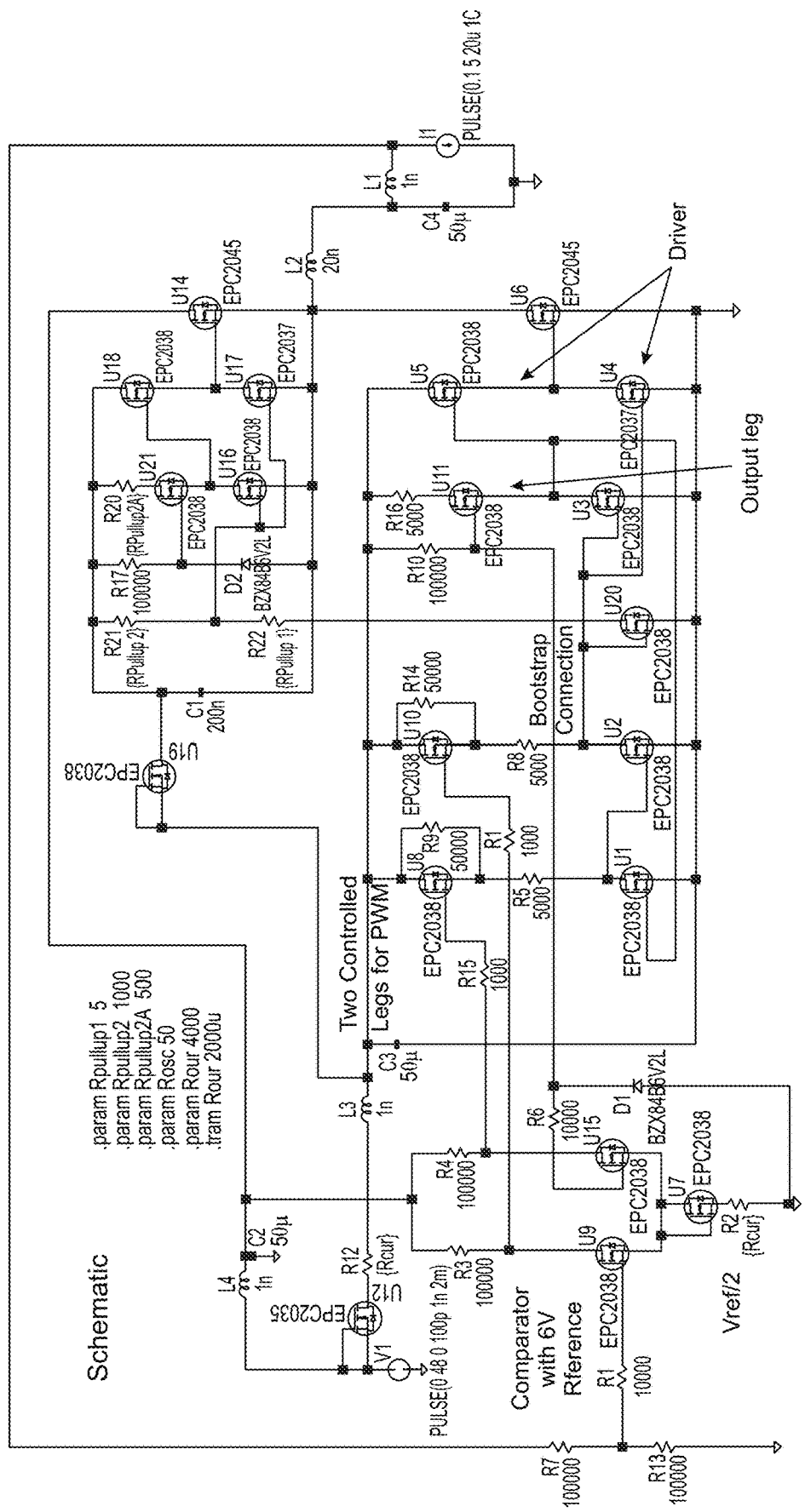
FIG. 6 is a simplified diagram showing how a comparator combined with subsequent stages may provide a convertor, such as a buck convertor.

Reference is now made to FIG. 6, which is a simplified diagram showing a variation of the circuit in FIG. 3 to provide a 48V to 12V buck converter. As shown, the circuit includes a comparator circuit as before, with a gate voltage tied to the common node of the comparator inputs.

Figure 7:
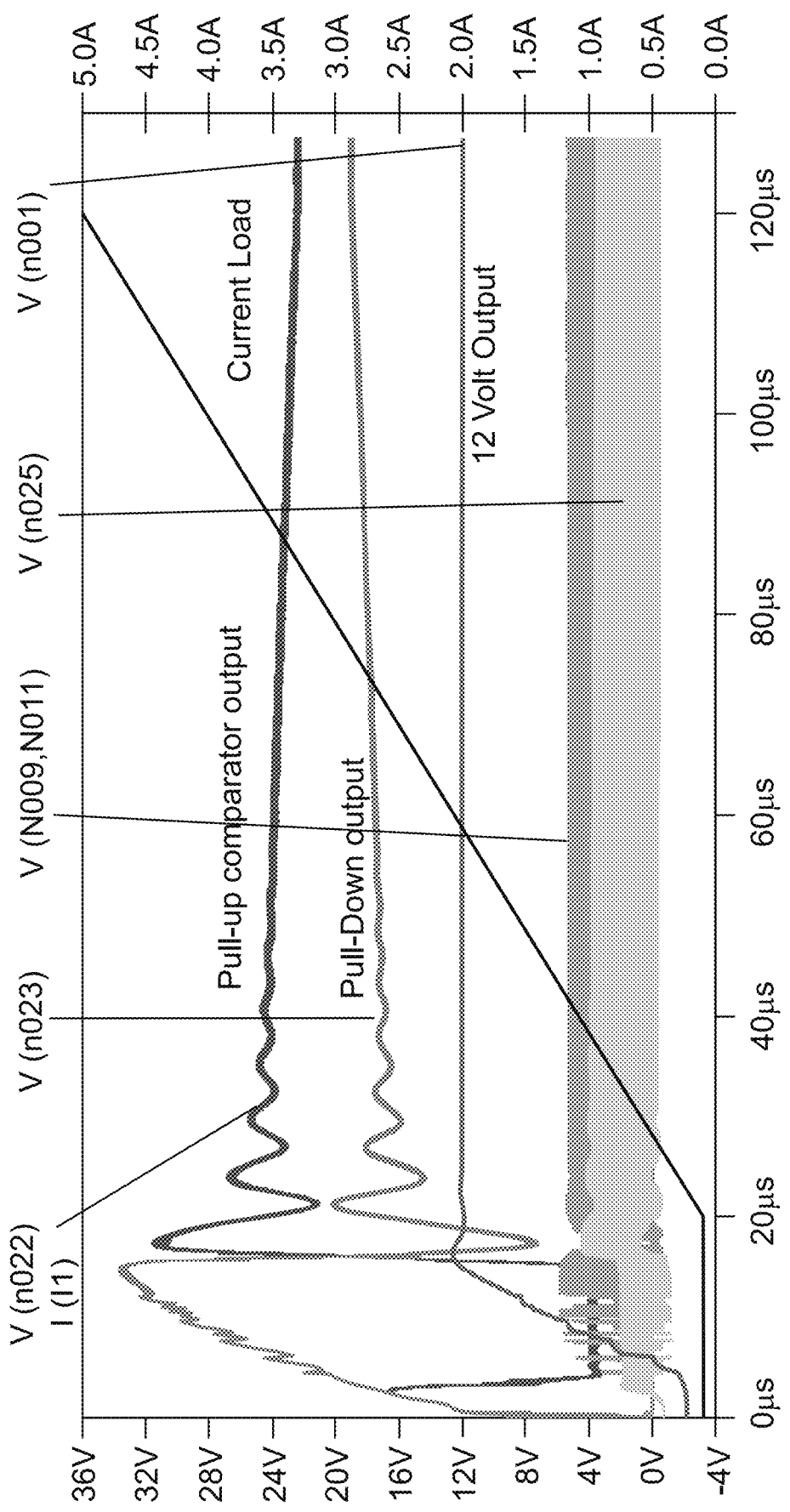
FIG. 7 is a graph showing waveforms for the device in FIG. 6.

There is bootstrapping of the upper switch, which makes a half-bridge circuit. The comparator drives two controlled legs for the ring oscillator. The circuit is able to provide a constant voltage, say 12V to a load, and provide a current in a range between 0.1 and 5 A. FIG. 7 shows waveforms at 12V including the control.

Figure 8:
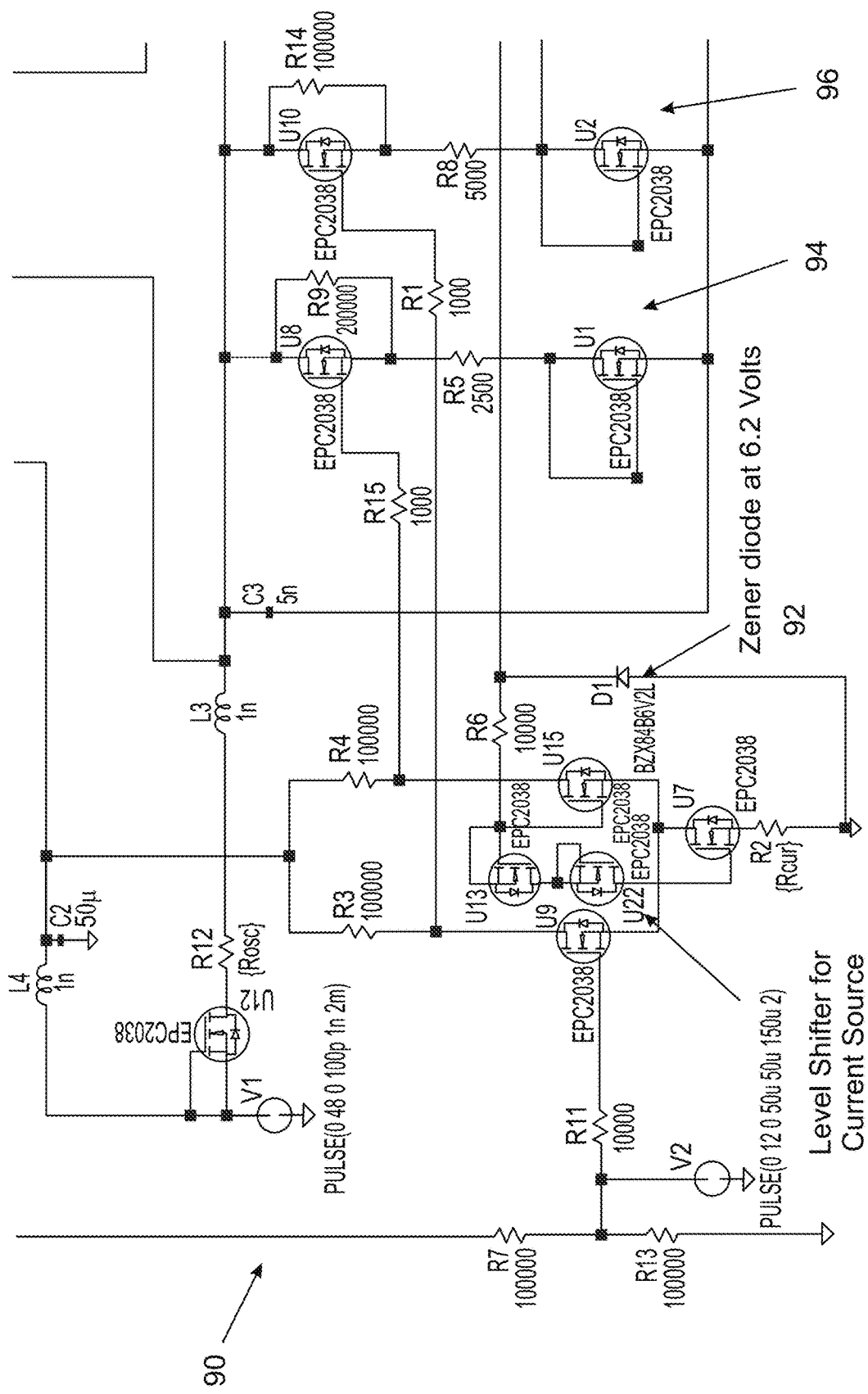
FIG. 8 is a simplified diagram showing a circuit in which a Zener diode provides a reference voltage.
Figure 9:
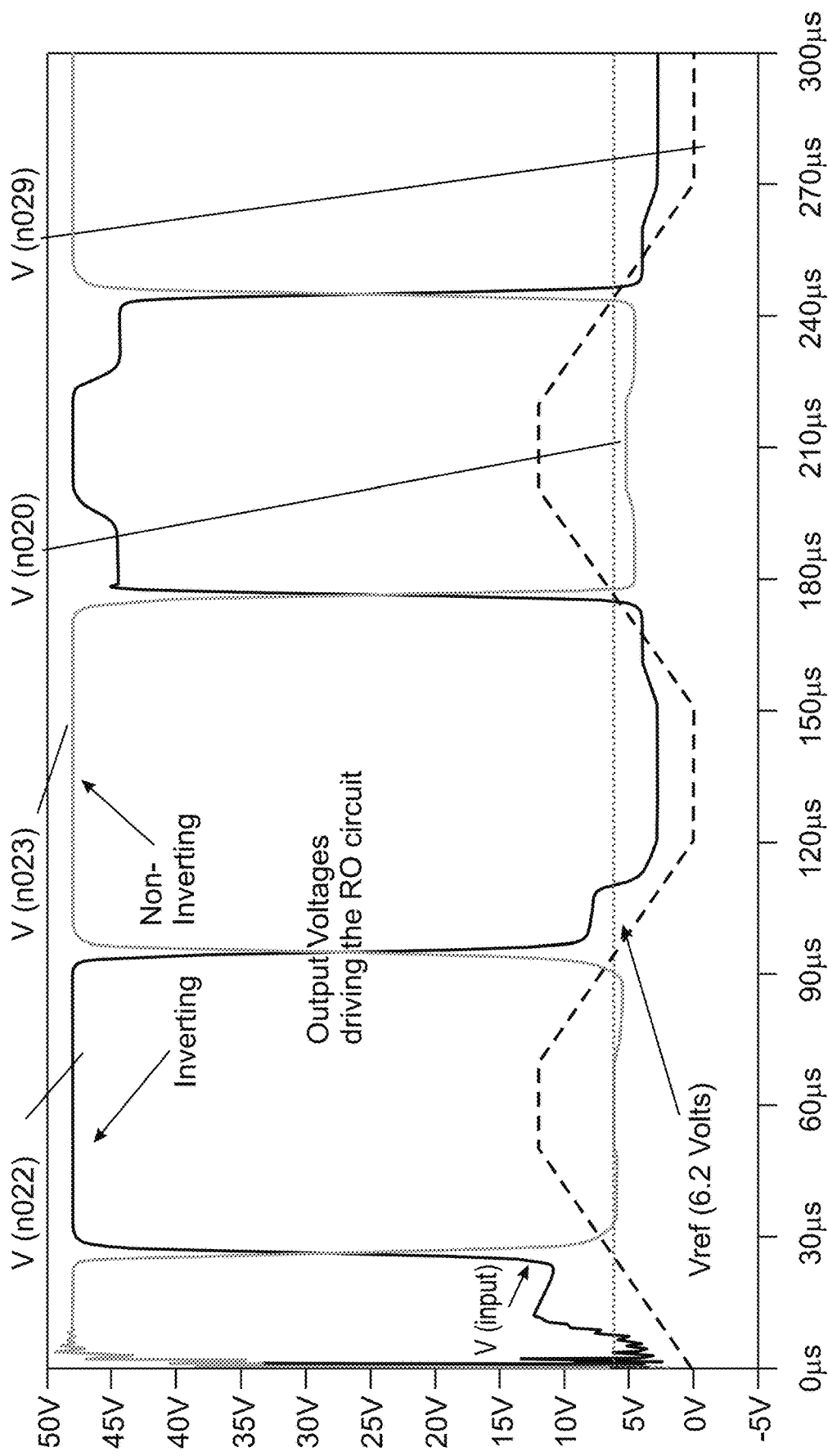
FIG. 9 is a simplified diagram illustrating the waveforms of the device of FIG. 8.

FIG. 8 shows a comparator circuit, 90, in which a Zener diode 92 sets a reference voltage for the comparator circuit. Subsequent ring oscillator stages 94 and 96 are shown. FIG. 9 shows the waveforms for the comparator circuit, specifically the comparator output against the input voltage.

Returning to the comparator, and a difference amplifier consists of a single transistor connected to a voltage reference source, in the example schematic shown, it is simply connected to the drain, which is the source of two equal transistors. The right-side upper transistor is connected to a voltage reference source such as a Zener diode. This reference should be larger than two times the threshold voltage but not as high as 6V plus one threshold voltage, due to the gate voltage limitation of the devices.

It is expected that during the life of a patent maturing from this application many relevant GaN components, including ring oscillators and comparators will be developed and the scopes of these and other corresponding terms are intended to include all such new technologies a priori.

The terms "comprises", "comprising", "includes", "including", "having" and their conjugates mean "including but not limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment and the present description is to be construed as if such embodiments are explicitly set forth herein. Conversely, various features of the invention, which are, for brevity, described in the context of a single embodiment, may also be provided separately or in any suitable subcombination or may be suitable as a modification for any other described embodiment of the invention and the present description is to be construed as if such separate embodiments, subcombinations and modified embodiments are explicitly set forth herein. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Figure 10:
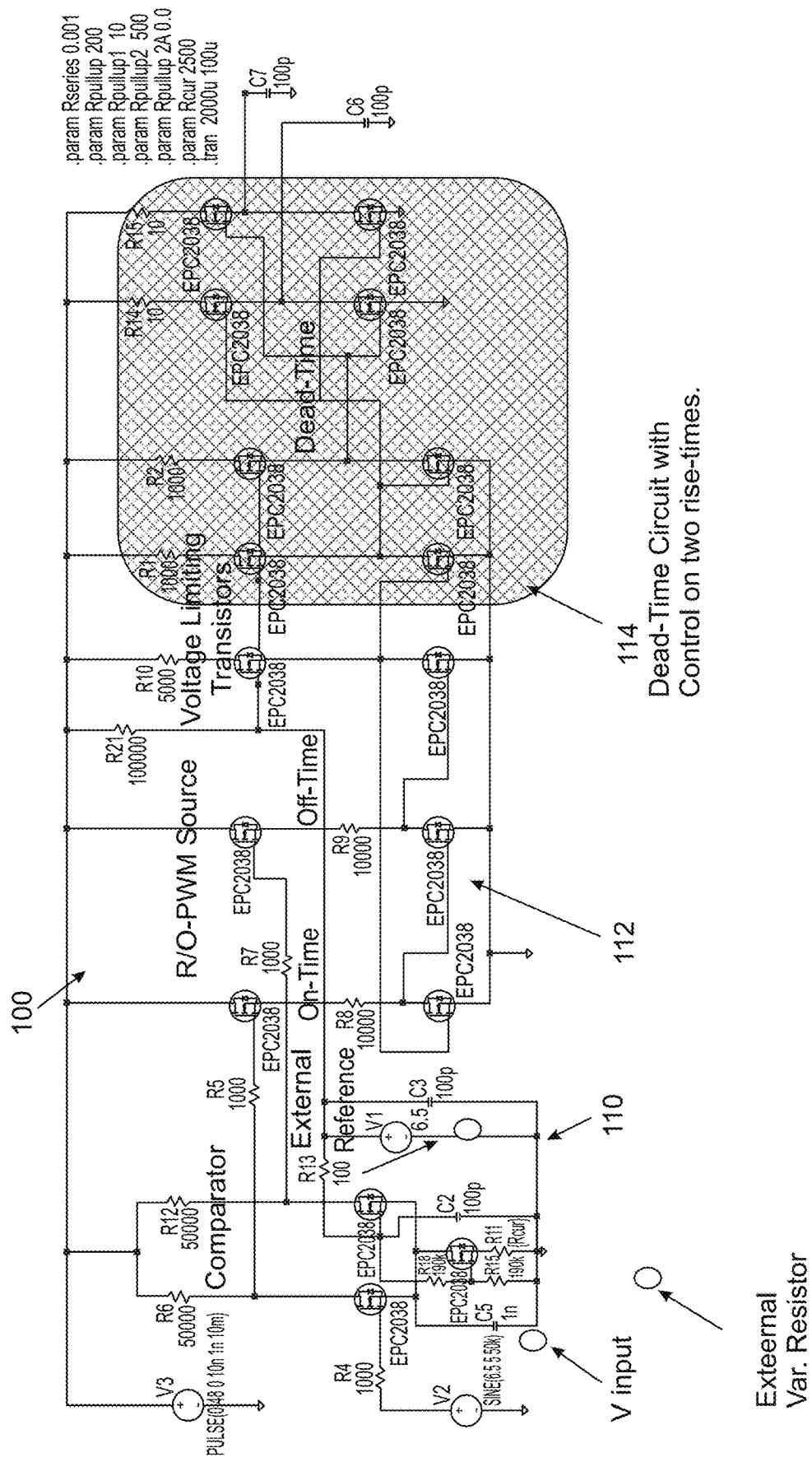
FIG. 10 is a diagram of an exemplary comparator-pulse width modulator circuit according to embodiments of the present invention.
Figure 11A:
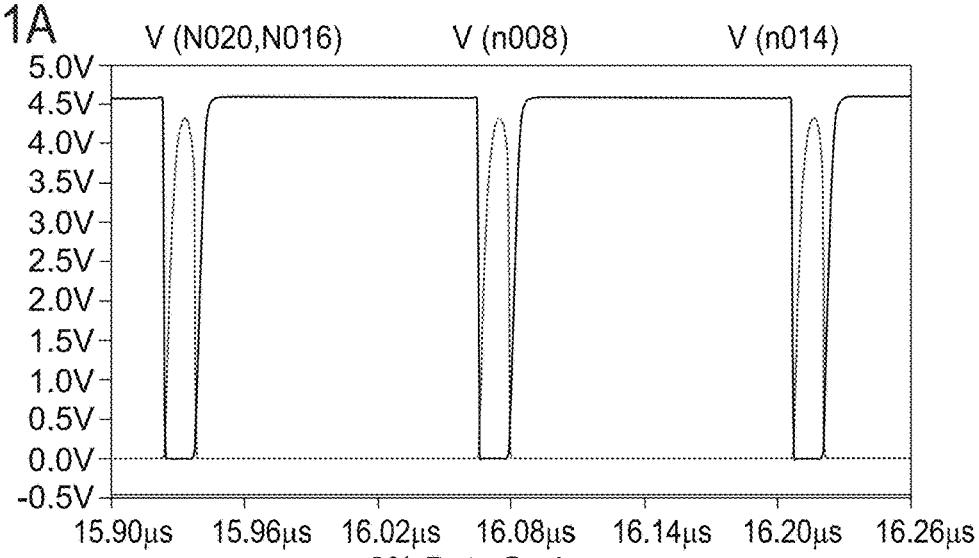
FIGS. 11A, 11B and 11C are waveform diagrams associated with the circuit of FIG. 10.
Figure 11B:
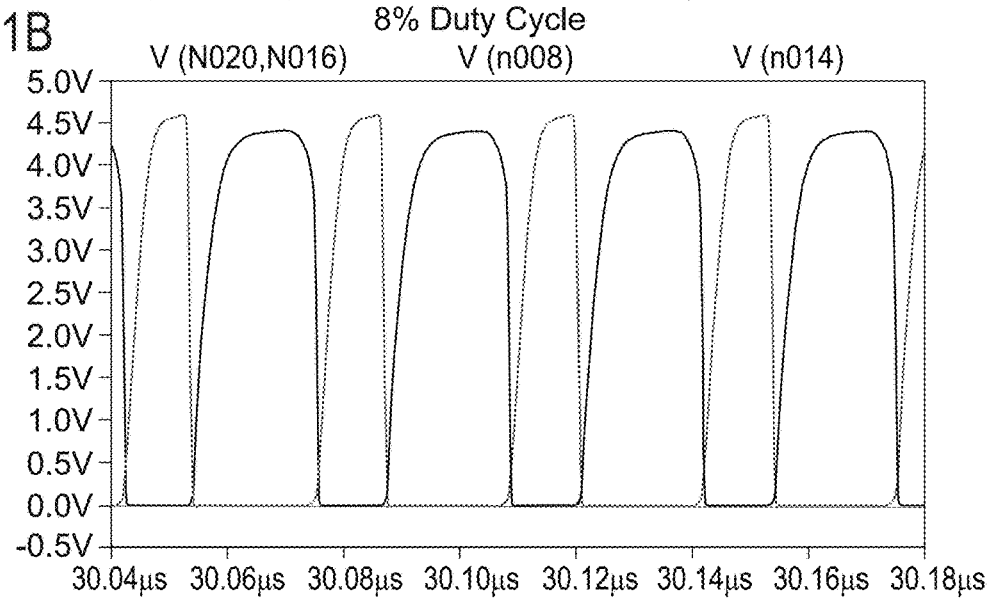
Figure 11C:
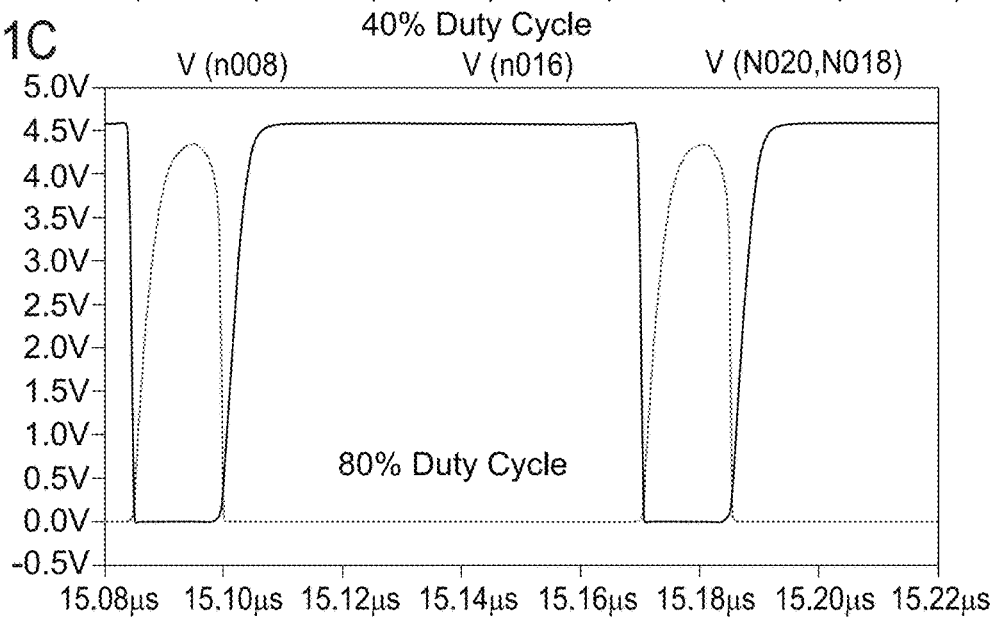

Referring now to FIG. 10, exemplary circuits were built using the commercially available EPC2152 transistor to provide a ring oscillator with a constant frequency and pulse width modulation to obtain a system on a chip that is capable of operating at greater than 1 MHz. FIG. 10 illustrates a comparator, pulse width modulator driver circuit 100 implemented using enhancement mode GaN technology in the form of the EPC2152 IC, for example. A comparator 110 uses an external reference to set on and off times and define a duty cycle for a pulse width modulator 112. A dead time correction circuit 114 controls rise time, and specifically two rise times. Operation of the dead time correction circuits is shown in FIG. 11A for an 8% duty cycle, in FIG. 11B for a 40% duty cycle and in FIG. 11C for an 80% duty cycle.

Figure 12:
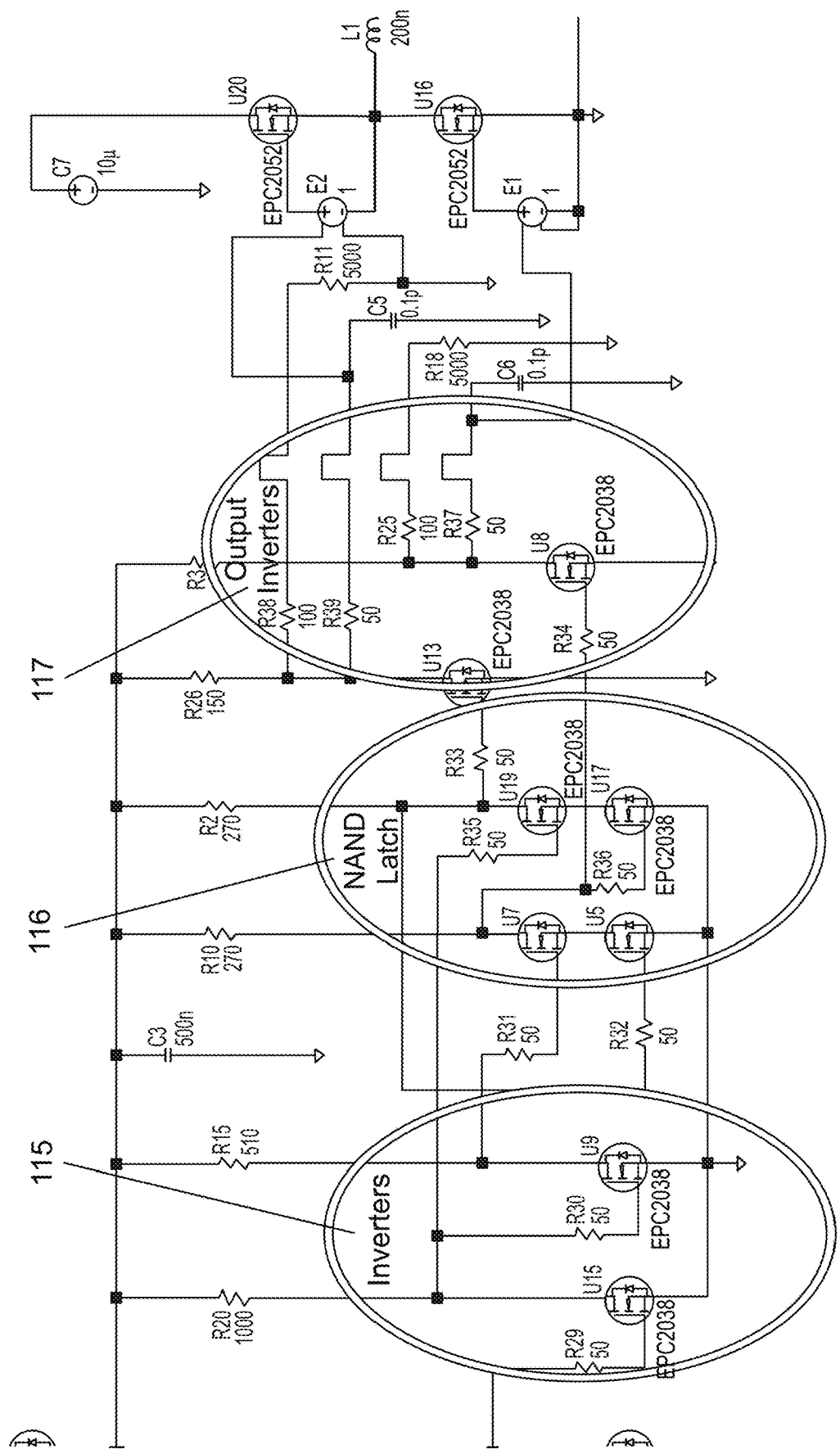
FIG. 12 is a variation of the circuit of FIG. 10, in which dead time correction is achieved using a NAND or NOR latch.

Such a dead time correction may also be implemented using simple transistor-resistor logic as is well known in the art, and a simple latch (NAND or NOR) may serve to separate the upper and lower signals. The upper and lower signals may then be fed into a pair of inverters or directly to the output driver transistors, and the resulting circuit is shown in FIG. 12. As shown in FIG. 12, inverters 115 feed into NAND latch 116, which latches the feed, and output inverter 117 sets the two separate signals as the output from the latch.

The circuit made up of the inverters 115 and 117 and the latch 116 serves to establish the dead-time.

Figure 13:
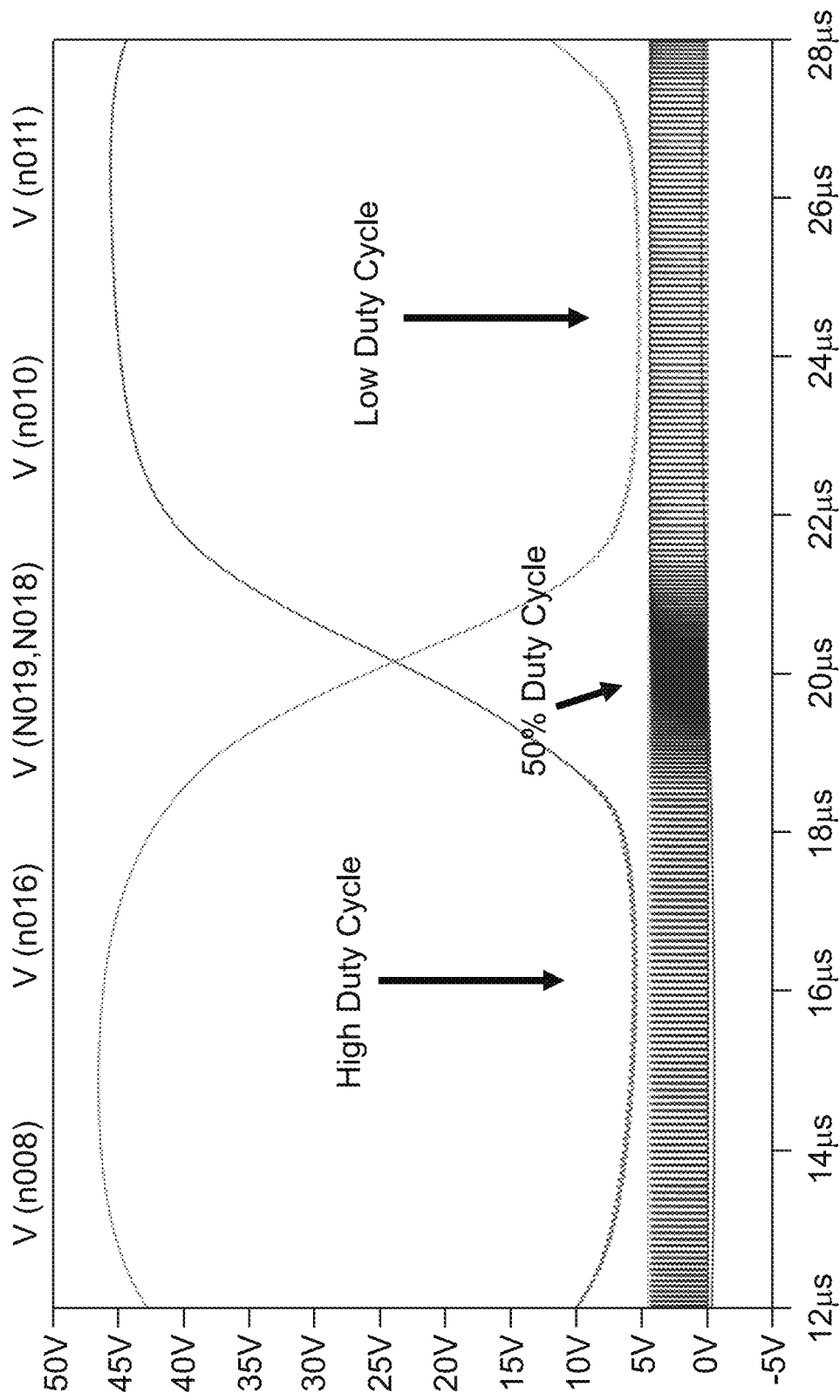
FIG. 13 is a waveform diagram associated with the circuit of FIG. 10.
Figure 14:
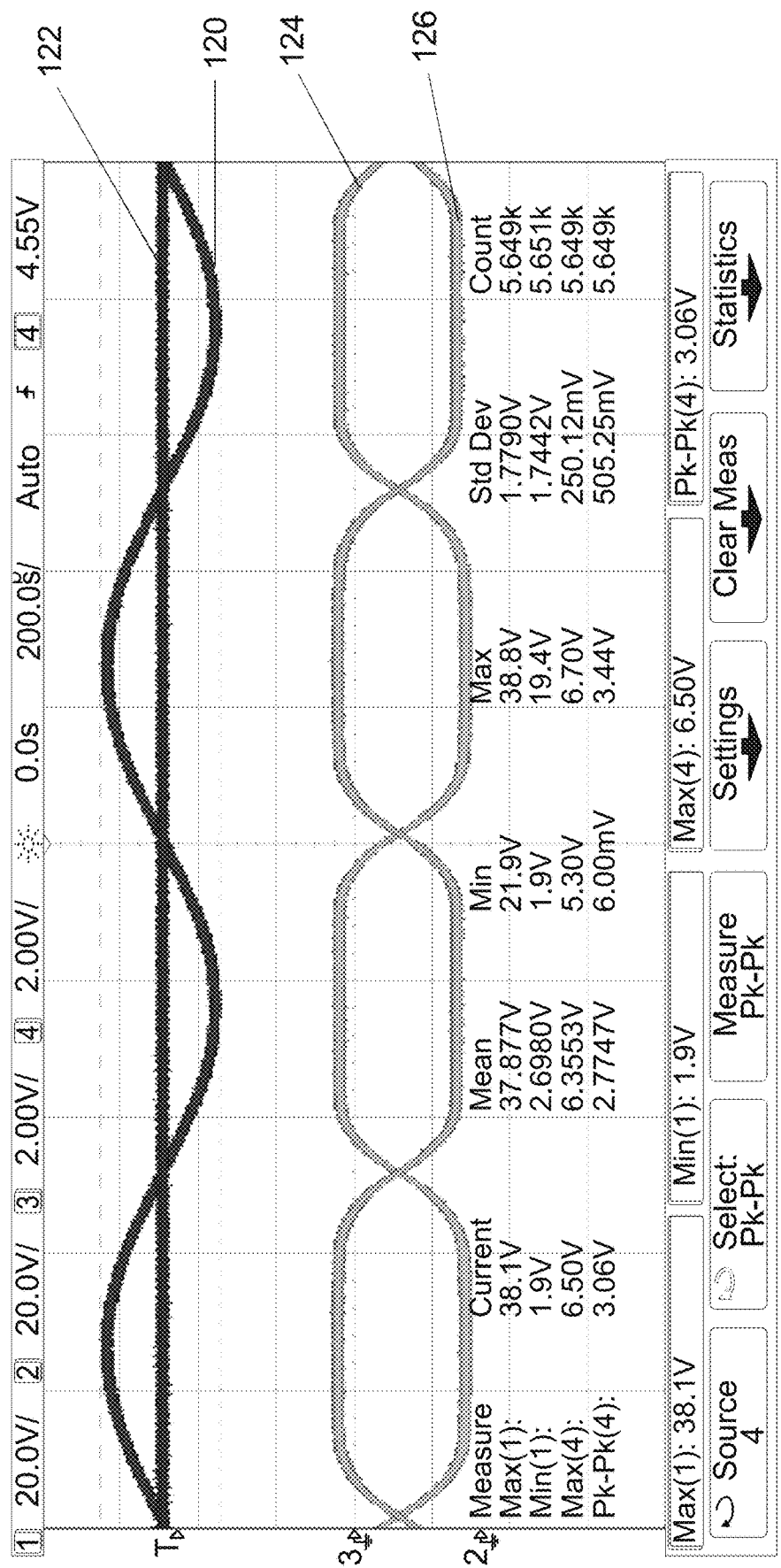
FIG. 14 is a waveform diagram associated with the circuit of FIG. 10.

FIG. 13 illustrates the output of the comparator 110 at high, 50% and low duty cycles. FIG. 14 is the output, showing the PWM operation. An input voltage 120 oscillates above and below reference voltage 122 to produce a comparator output defining an on time 124 and an off time 126.

FIG. 15 shows a range 130, 132, 134, of duty cycles of the PWM varying between 10% and 90% as measured on an oscilloscope.

The exemplary circuit was built on a circuit board, and the board itself shows a 100 pF input capacitance, which takes a lot of energy at frequencies in the range of 1-3 MHz. Hence a monolithic system on a chip is more efficient, there being generally only gate capacitance, and it allowing use of the smallest transistors it is possible to print.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. An integrated circuit built with enhancement mode Gallium Nitride (GaN) components, the integrated circuit comprising a comparator circuit configured to compare an input voltage with a reference voltage to provide a controllable constant current source, the comparator having a first drive transistor having a positive threshold voltage, the drive transistor being switched on and off based on a comparison result of said comparator, the integrated circuit further comprising an odd number of ring oscillator stages connected after said drivers, said ring oscillator stages forming a ring oscillator having a constant frequency.

2. The integrated circuit of claim 1, further comprising a second drive transistor connected in respect of said first drive transistor, said two drive transistors providing complementary pull up and pull down drivers.

3. The integrated circuit of claim 1, configured such that said comparator circuit combined with said ring oscillator provides a pulse width modulator governed by said comparator circuit.

4. The integrated circuit of claim 1, wherein said ring oscillator stages comprise a boost converter or a buck converter or a buck-boost converter.

5. The integrated circuit according to claim 1, wherein at least one of said ring oscillator stages comprises a drive transistor having a source and a drain and resistors connected to each of said source and said drain.

6. The integrated circuit of claim 5, wherein said resistor connected to said drain provides a current regulator to regulate a drive current provided by said stage.

7. The integrated circuit of claim 6, configured such that a frequency of said ring oscillator is maintained and said comparator result is used to change a duty cycle of said ring oscillator without substantially changing said frequency.

8. The integrated circuit of claim 7, configured to use a boost convertor or a buck convertor to set said duty cycle.

9. An electrical circuit comprising enhancement mode Gallium Nitride (GaN) components, the circuit comprising a comparator circuit configured to compare an input voltage with a reference voltage to provide a controllable constant current source, the comparator having a first drive transistor having a positive threshold voltage, the drive transistor being switched on and off based on a comparison result of said comparator, the circuit further comprising an odd number of ring oscillator stages connected after said drivers, said ring oscillator stages forming a ring oscillator having a substantially constant frequency.

10. The circuit of claim 9, further comprising a second drive transistor connected in respect of said first drive transistor, said two drive transistors providing complementary pull up and pull down drivers.

11. The circuit of claim 9, configured such that said comparator circuit combined with said ring oscillator provides a pulse width modulator governed by said comparator circuit.

12. The circuit of claim 9, wherein said ring oscillator stages comprise a boost converter or a buck converter or a boost-buck converter.

13. The circuit of claim 9, comprising a dead time correction feature to control a rise time.

14. The circuit of claim 13, wherein said dead time correction circuit comprises a latch.

15. A method of controlling an integrated circuit built with enhancement mode Gallium Nitride (GaN) components, the method comprising providing a comparator circuit which compares an input voltage with a reference voltage to output a controllable current at a drive transistor, the comparator having a first drive transistor having a positive threshold voltage, the drive transistor being modulated from on to off based on a comparison result of said comparator, thereby to provide said controllable current, and providing an odd number of ring oscillator stages connected after said drivers, said ring oscillator stages forming a ring oscillator having a constant frequency.

16. The method of claim 15, comprising providing said controllable current as a constant current, said first drive transistor being either fully on or fully off.

17. The method of claim 15, further comprising providing a second drive transistor connected in respect of said first drive transistor, said two drive transistors providing complementary pull up and pull down drivers.

18. The method of claim 15, comprising operating said ring oscillator as a pulse width modulator governed by said comparator circuit.

19. The method of claim 15, comprising driving said ring oscillator stages as a boost converter or a buck converter or a boost-buck converter.

20. The method of claim 19, wherein a frequency of said ring oscillator is maintained and said comparator result is used to change a duty cycle of said ring oscillator without changing said frequency.

21. The method of claim 20, comprising using a boost convertor or a buck convertor to set said duty cycle.

* * * * *